United States Patent [19]

Washizuka et al.

[11] Patent Number: 4,686,091
[45] Date of Patent: Aug. 11, 1987

[54] APPARATUS FOR MANUFACTURING COMPOUND SEMICONDUCTOR SINGLE CRYSTAL

[75] Inventors: Syoichi Washizuka; Masayuki Watanabe, both of Yokohama; Sadao Yashiro, Tokyo; Masae Nakanishi, Chigasaki, all of Japan

[73] Assignee: Kabushiki Kaisha Toshiba, Kawasaki, Japan

[21] Appl. No.: 758,403

[22] Filed: Jul. 24, 1985

[30] Foreign Application Priority Data

Sep. 5, 1984 [JP] Japan ............................. 59-185726

[51] Int. Cl.⁴ .............................................. C30B 27/02
[52] U.S. Cl. .................................... 422/249; 156/607; 156/617 SP; 156/DIG. 83
[58] Field of Search ............ 156/607, 617 SP, 617 V, 156/DIG. 70, DIG. 73, DIG. 83; 422/248, 249

[56] References Cited

U.S. PATENT DOCUMENTS

| Re. 31,473 | 12/1983 | Kilby et al. | 425/6 |
|---|---|---|---|
| 92,511 | 7/1869 | Baxter | 126/211 |
| 1,370,113 | 3/1921 | Janusonis | 126/211 |
| 3,511,610 | 5/1970 | Dohmen | 422/249 |
| 3,715,194 | 2/1973 | Plooster | 156/617 SP |
| 4,478,675 | 10/1984 | Akai | 156/DIG. 83 X |
| 4,540,673 | 9/1985 | Takeda et al. | 501/151 X |

FOREIGN PATENT DOCUMENTS

| 3248103 | 12/1983 | Fed. Rep. of Germany . | |
|---|---|---|---|
| 141629 | 2/1961 | U.S.S.R. | 156/617 SP |

Primary Examiner—David L. Lacey
Assistant Examiner—Michael S. Gzybowski
Attorney, Agent, or Firm—Oblon, Fisher, Spivak, McClelland & Maier

[57] ABSTRACT

An apparatus has a crucible for containing a GaAs raw material melt and a $B_2O_3$ liquid encapsulating material therein, a heat generator arranged around the crucible so as to be coaxial therewith, and a heat insulator assembly arranged around the heat generator to surround the heat generator and the crucible for the purpose of manufacturing a compound semiconductor single crystal by pulling it from the raw material melt in the crucible by the LEC method. In the heat insulator assembly of the apparatus of the above construction, an upper heat insulator, arranged above the crucible and having at its center a circular hole for receiving the single crystal being pulled, comprises a plurality of radially divided sector-shaped split members. The split members are sintered bodies having aluminum nitride (AlN) as a major constituent.

7 Claims, 20 Drawing Figures

F I G. 2A
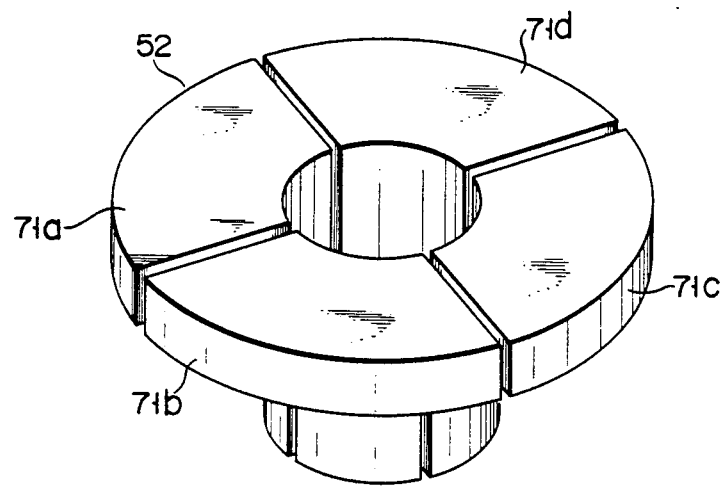
F I G. 2B
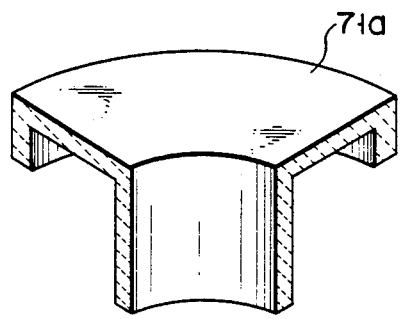

F I G. 9
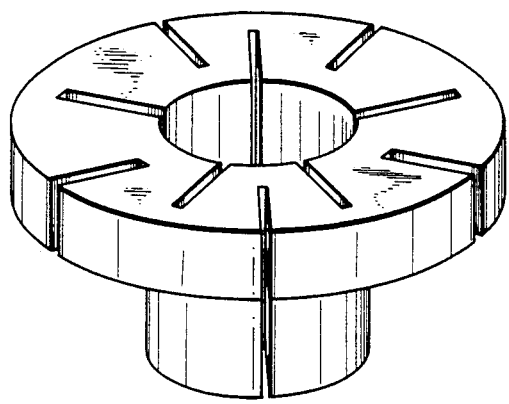

APPARATUS FOR MANUFACTURING COMPOUND SEMICONDUCTOR SINGLE CRYSTAL

BACKGROUND OF THE INVENTION

The present invention relates to an apparatus for manufacturing a compound semiconductor single crystal by pulling it according to the LEC (Liquid Encapsulated Czochralski) method.

The LEC method has recently been proposed as a method of manufacturing a single crystal of a compound semiconductor having a high decomposition pressure at a melting point such as GaAS, GaP or InP. This method involves crystal growth at high temperature and high pressure, i.e., a strict thermal environment for crystal growth. For this reason, stable crystal growth and control of crystal quality may be difficult to attain.

A conventional apparatus for manufacturing a compound semiconductor single crystal utilizing the LEC method will briefly be described with reference to FIG. 11. A crucible 120 supported by a crucible holder 130 is disposed in a high-pressure container 110 and is heated by a heat generator 140 coaxially surrounding it. Upon heating by the heat generator 140, a raw material melt 161 and a liquid encapsulating material 162 covering it, are formed in the crucible 120.

Decomposition of the raw material melt 161 at high temperatures is controlled by the liquid encapsulating material 162 and a pressurized inert gas 167. A single crystal 165 is formed through the liquid encapsulating material 162 by bringing a seed crystal into contact with the melt 161 in the crucible 120 and pulling the seed crystal while rotating a pulling rod.

A heat insulator assembly 150 (heat insulators 151, 152, and 153) is arranged around the circumferential and upper and lower surfaces of the heat generator 140 so as to guarantee good heating efficiency of the heat generator 140, and to maintain optimal temperature distribution in the crucible 120. The heat insulators normally comprise carbon members.

However, such carbon products are easily oxidized and degraded by oxygen or water vapor in an atmosphere gas. Consequently, a satisfactory heating efficiency and optimal temperature distribution in the crucible cannot be obtained when the crucible 120 is heated by the heat generator 140. In addition, the raw material melt is contaminated by oxides formed by oxidation. These factors degrade the manufacturing yield and quality of single crystals manufactured by the LEC method.

For example, GaAs single crystals, which are recently receiving public attention as ultra high-speed IC substrates, contain carbon as a p-type impurity in the amount of $1 \times 10^{16}$ cm$^{-3}$ or more for the reasons described above. This has presented a big problem in manufacturing an un-doped, uniform, semiinsulating substrate with good reproducibility and without thermal degradation.

In view of this problem, it has been proposed to coat the carbon heat insulator assembly 150 with a thin film of PBN, $Si_3N_4$ or SiC by the CVD method, so as to prevent the above-mentioned contamination. However, in a heat insulator having such a thin film, film degradation is significant after repeated use at high temperature and pressure since the carbon and film have different coefficients of thermal expansion and the film has only a limited density. Moreover, the composition of the thin film can easily contaminate the raw material melt. For these reasons, it has been difficult to manufacture uniform, semiinsulating substrates with good reproducibility.

The present inventors experimentally manufactured a heat insulator assembly 150 of AlN, $Al_2O_3$, $ZrO_2$ or the like, in place of carbon in an attempt to prevent contamination by carbon. The results revealed that the problems encountered with the CVD thin film could be prevented, and contamination with carbon could be eliminated. However, when one of the carbon replacing substances proposed above is sintered, in order to maintain a satisfactory mechanical strength of final products an alkali earth metal oxide (e.g., CaO or MgO) or a rare earth element oxide (e.g., $Y_2O_3$ or $La_2O_3$) must be added in an amount of a few % as a binder. This provides another contamination source to the raw material melt by smearing out of the binder component upon repeated use at high temperature and high pressure. In particular, Ca or Mg is an impurity which can form an electrically active level, therefore, the use of Ca or Mg presents a problem in manufacturing a uniform, semiinsulating substrate with good reproducibility. Furthermore, the above-mentioned substances have thermal conductivities lower than that of carbon, which is generally used. For example, AlN has a thermal conductivity of about 50 W/m.K and $Al_2O_3$ has a thermal conductivity of about 20 W/m.K, which are less than 1/10 that of carbon. For this reason, a heat insulator assembly 150, formed of one of the above-mentioned substances, has a non-uniform temperature distribution and is easily damaged by thermal stress. The above situation can be summarized by noting that a large amount of a binder must be used in order to increase mechanical strength, yet that contamination of a raw material melt increases when a large amount of a binder is used.

In the heat insulator assembly 150, the upper heat insulator 152 shown in FIG. 12 has a particularly low thermal symmetry as compared with the side heat insulator 151 and the lower heat insulator 153. In addition, since the surface of the upper heat insulator 152 is directly cooled by convection of the pressurized inert gas 167, a large temperature difference exists between the inner and outer diameter portions. Therefore, the upper heat insulator 152, in particular, in the heat insulator assembly 150, suffers from the problem of easy damage by thermal stress.

In view of the problems discussed above, it has been difficult to use a sintered body of AlN, $Al_2O_3$, $ZrO_2$ or the like, for a heat insulator assembly, in particular, an upper heat insulator having satisfactory thermal resistance and mechanical strength while preventing carbon contamination of the raw material melt to thereby maintain the high purity of the melt.

SUMMARY OF THE INVENTION

It is an object of the present invention to provide an apparatus for manufacturing a compound semiconductor single crystal which can increase the mechanical strength of a heat insulator assembly, in particular, an upper heat insulator made of AlN, $Al_2O_3$, $ZrO_2$ or the like; can prevent the heat insulator assembly from acting as a contamination source of the raw material melt, and can improve the quality and manufacturing yield of the single crystal.

In order to achieve the above object of the present invention, there is provided an apparatus for manufacturing a compound semiconductor single crystal by pulling the compound semiconductor single crystal from the raw material melt in the crucible by the LEC method, comprising a crucible for holding raw material melt and a liquid encapsulating material therein, a heat generator arranged around the crucible so as to be coaxial therewith, a heat insulator assembly arranged outside the heat generator so as to surround the heat generator and the crucible, and a container for holding the crucible. The heat generator and the heat insulator assembly therein, wherein the heat insulator assembly, an upper heat insulator arranged above the crucible and having at the center thereof a circular hole for allowing passage of the pulled single crystal, comprises at least two split pieces each comprising a sinter formed body having one of AlN, $Al_2O_3$ and $ZrO_2$ as a major constituent.

The present invention as described above can provide the following four effects (1) to (4):

(1) Since a heat insulator assembly (upper heat insulator) has a split structure, it has an improved thermal shock resistance and a long life.

(2) Since the thermal shock resistance of the heat insulator is improved, the amount of a binder added for increasing the mechanical strength can be decreased. Thus, contamination of the raw material melt with carbon and a binder can be reduced to a minimum. A high-purity melt can be obtained, and the quality of the pulled single crystal is improved.

(3) Oxidation and degradation of heat insulators upon repeated use at high temperatures is prevented. A good heating efficiency of the heat generator and an optimal temperature distribution within the crucible can be obtained.

(4) Productivity can be improved due to improvements in reproducibility and stability in the manufacture of single crystals.

BRIEF DESCRIPTION OF THE DRAWINGS

FIG. 2A is a perspective view showing the schematic structure of an upper heat insulator used in the apparatus shown in FIG. 1;

FIG. 2B is a perspective view showing one split member of the upper heat insulator shown in FIG. 2A;

FIGS. 6 to 10B are views showing the schematic structures of upper heat insulators used in apparatuses according to other embodiments of the present invention, in which:

FIG. 6 is a perspective view showing the schematic structure of an upper heat insulator using a cover plate, FIG. 7 is a plan view showing the schematic structure of an upper heat insulator which is split radially and concentrically, FIG. 9 is a perspective view showing the schematic structure of an upper heat insulator with slits, FIG. 10B is a perspective view showing one split member of the upper heat insulator shown in FIG. 10A;

DETAILED DESCRIPTION OF THE PREFERRED EMBODIMENTS

Figure 1:
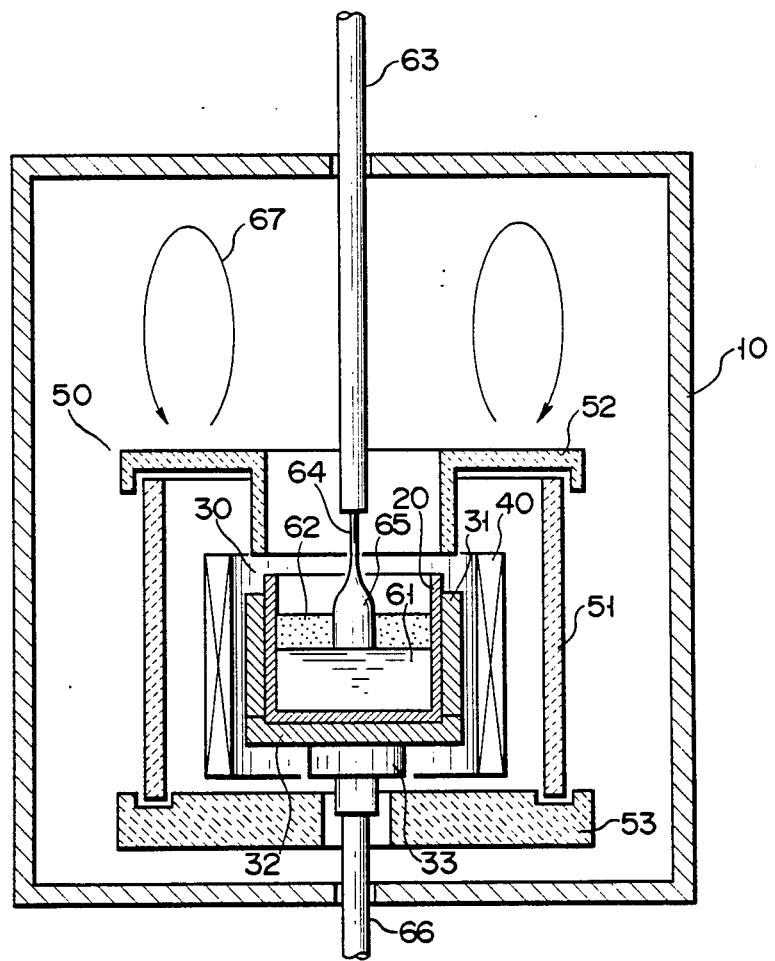
FIG. 1 is a sectional view showing the schematic construction of an apparatus for manufacturing a compound semiconductor single crystal according to a first embodiment of the present invention.

FIG. 1 is a sectional view showing the schematic construction of an apparatus for manufacturing a compound semiconductor single crystal according to a first embodiment of the present invention.

Referring to FIG. 1, reference numeral 1 denotes a high-pressure container consisting of stainless steel or the like. The container 1 contains therein a crucible 20, a crucible holder 30, a heat generator 40, a heat insulator assembly 50 and the like. The crucible 20 consists of, e.g., PBN, and has a cylindrical shape with a bottom. The crucible 20 contains therein metal Ga and metal As as a supply source of a raw material melt 61, and $B_2O_3$ or the like as a source of a liquid encapsulating material 62. A seed crystal 64 is mounted at the lower end of a crystal pulling shaft 63 extending through the upper wall of a container 10. After the seed crystal 64 is brought into contact with the raw material melt 61, the shaft 61 is pulled while being rotated, thereby pulling a GaAs single crystal 65.

The crucible 20 is supported by the crucible holder 30. The crucible holder 30 comprises a combination of a cylinder 31, a bottom plate 32 and a seat 33. The cylinder 31 is in contact with the crucible 20 so as to surround its outer circumferential surface, and the bottom plate 32 is in contact with the bottom portion of the crucible 20. The seat 33 supports the bottom plate 32. The cylinder 31, the bottom plate 32 and the seat 33, constituting the crucible holder 30, comprise sintered bodies of AlN.

A rotating shaft 66 is mounted on the seat 33 of the holder 30 and extends through the bottom wall of the container 10. When the rotating shaft 66 is rotated by a rotating mechanism (not shown), the crucible 20 is rotated.

The cylindrical heat generator 40, consisting of carbon or the like, is coaxially arranged around the holder 30 with a gap therebetween. The heat generator 40 heats and melts the raw material and the encapsulating material in the crucible 20 so as to form the raw material melt 61 and the overlying liquid encapsulating material 62.

The heat insulator assembly 50 is arranged outside the heat generator 40 so as to surround the crucible 20, the holder 30 and the heat generator 40. The heat insulator assembly 50 consists of a side heat insulator 51, an upper heat insulator 52 and a bottom heat insulator 53. The side heat insulator 51 comprises a cylinder having a diameter and a length larger than those of the heat generator 40, and which is coaxial with the heat generator 40. The upper heat insulator 52 comprises a plurality of split members which are obtained by dividing a disk, as will be described later. The upper heat insulator 52 has a circular hole through which the single crystal being pulled from the crucible 20 can pass. The upper heat insulator 52 is arranged on the side heat insulator 51. The bottom heat insulator 53 comprises a disk member which has a hole for receiving the rotating shaft 66 at its center. The bottom heat insulator 53 is arranged below the side heat insulator 51. The heat insulators 51, 52 and 53, constituting the assembly 50, comprise AlN sintered bodies, as in the case of the crucible holder 30.

In this manner, the apparatus of the first embodiment of the present invention has a construction basically the same as that of a conventional apparatus, being different therefrom in that the heat insulator assembly 50 comprises AlN sintered bodies while the upper heat insulator 52 comprises a group of a plurality of split members.

Each AlN sintered body was formed in the following manner. $Y_2O_3$ was added as a binder in the amount of about 1% to a high-purity AlN fine powder, and the resultant mixture was granulated and formed. After degreasing in a nitrogen atmosphere at about 700° C., the formed body was sintered at about 1,800° C. and at normal pressure. Then, a high-purity sintered body having a binder content of about 0.3% or less was obtained. The sintered body had a mechanical strength which was less than ½ of 40 to 50 kg/mm² of a normal sintered body having a binder content of a few %.

The upper heat insulator 52, as a characteristic feature of the present invention, comprises such an AlN sintered body, and is formed into a shape as shown in FIGS. 2A and 2B. FIG. 2A is a perspective view showing the overall outer appearance of the upper heat insulator, and FIG. 2B is a perspective view showing one split member of the heat insulator shown in FIG. 2A. The upper heat insulator 52, shown in FIG. 2A, consists of four sector-shaped split members 71 (71a to 71d) as shown in FIG. 2B. The split members 71a to 71d have basically the same shape each split member is a sector-shaped plate obtained by radially dividing a disk having a central hole into four members.

In each of the inner and outer peripheries of each split member, an arcuated plate, obtained by longitudinally dividing a cylinder into four members, is formed integrally. When the four split members are combined, the sector-shaped plates constitute a disk member, the small-diameter arcuated plates constitute an inner cylinder, and the large-diameter arcuated plates constitute an outer cylinder.

Although the side heat insulator 51 and the lower heat insulator 53 are not split, they have the same composition as that of the upper heat insulator 52.

A case will be described wherein a GaAs single crystal is manufactured by the apparatus of the first embodiment of the present invention.

First, about 1 kg of GaAs melt 61 was prepared in a crucible 20, having an inner diameter of 100 mm, by the direct synthesis method. The synthesis step was performed in the following manner. After the crucible contents were heated to 600° C. within 1 hour, at which temperature a liquid encapsulating material 62 is sufficiently softened, the crucible was maintained at this temperature for another 30 minutes so as to completely cover the raw materials with the material 62. When the crucible contents were heated to 800° C. within 5 minutes, As was melted and began to react with Ga. Therefore, the crucible contents were rapidly heated to 1,200° C. within 5 minutes to obtain the GaAs melt 61. At this time, the pressure inside the container 10 was about 70 atm. The pressure inside the container 10 was set at 20 atm. and a seed crystal was brought into contact with the melt to grow 800 g of a [100] single crystal having a diameter of 55 mm. The single crystal was cooled to ambient temperature at a rate of −200° C./h.

The upper heat insulator 52 as shown in FIG. 2, which underwent such a heat cycle during direct synthesis pulling, did not experience any damage or cracking and was able to withstand an abrupt thermal shock. Similarly, though the side heat insulator 51 and the bottom heat insulator 53 did not have a split structure, they too suffered no damage or cracking.

Figure 11:
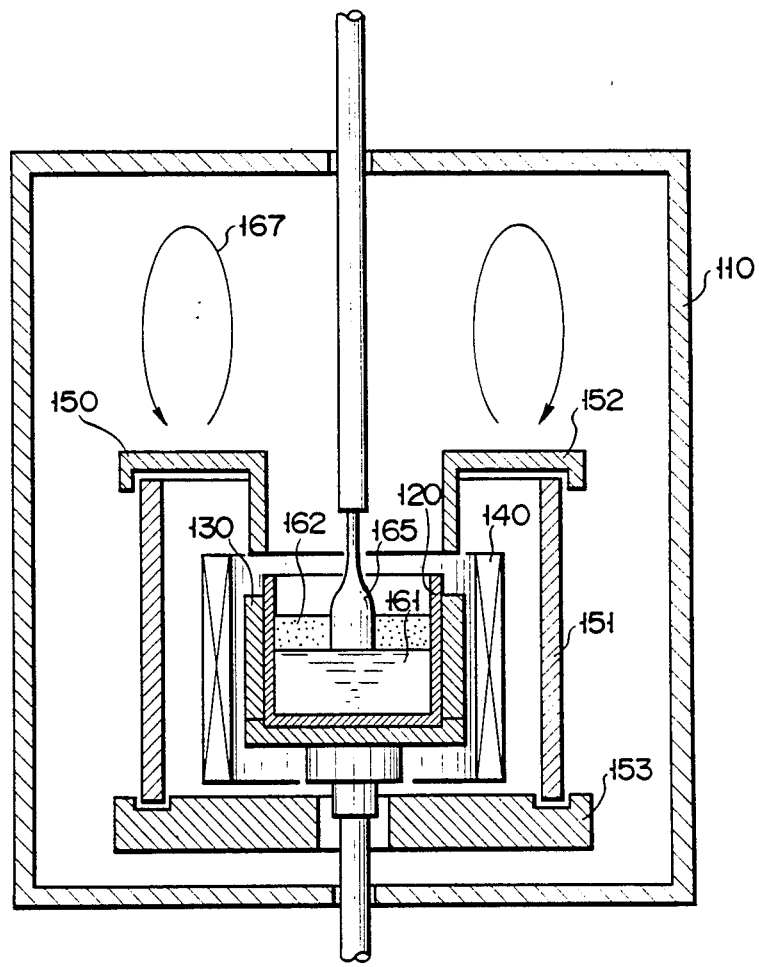
FIG. 11 is a sectional view showing the schematic construction of a conventional apparatus for manufacturing a compound semiconductor single crystal.

In contrast, when an upper heat insulator 152 as shown in FIG. 11 was used, the inner projecting portions were all chipped off into a number of small radial pieces. When an upper heat insulator 152, as shown in FIG. 11, comprised a sintered body containing 5% of a binder, a number of radial cracks were formed and the body could not be used again. In either case, the upper heat insulator 152, as shown in FIG. 11, could not withstand a thermal shock as described above. Yet, even when the upper heat insulator 52, as shown in FIG. 2, was used 50 consecutive times, it did not incur any abnormality.

When the carbon concentration near the central portion of a section of the head portion of the single crystal, manufactured in this manner, was measured by the infrared ray absorption method, it was $1 \times 10^{15}$ cm$^{-3}$, as compared to $1 \times 10^{16}$ cm$^{-3}$ of a single crystal manufactured by a conventional apparatus. Thus, according to the present invention, the carbon concentration can be reduced to 1/10 the conventional case. When impurity analysis of the crystal was performed by the plasma light-emission analysis method, the Al content was below the detection limit, and contamination with residual binder was not observed. On the other hand, when the upper heat insulator 152, as shown in FIG. 11, was used, the carbon concentration was about $8 \times 10^{15}$ cm$^{-3}$. When the upper heat insulator 152, as shown in FIG. 11, comprised a sintered body containing 5% of a binder, small amounts of Al and Y were detected, and a high-purity single crystal free from carbon and binder contamination could not be obtained.

In the apparatus of the embodiment of the present invention, since the upper heat insulator 52 consists of four split members, 71a to 71d, comprising AlN sintered bodies, the thermal shock resistance of the upper heat insulator 52 is greatly improved. For this reason, even if a sintered body of AlN or the like is used as an upper heat insulator 52, the amount of a binder to be added thereto to improve the mechanical strength, can be very small. Thus, a high-purity semiinsulating GaAs single crystal, free from carbon and binder contamination, could be manufactured with excellent reproducibility and stability, providing a great industrial advantage.

Figure 3A:
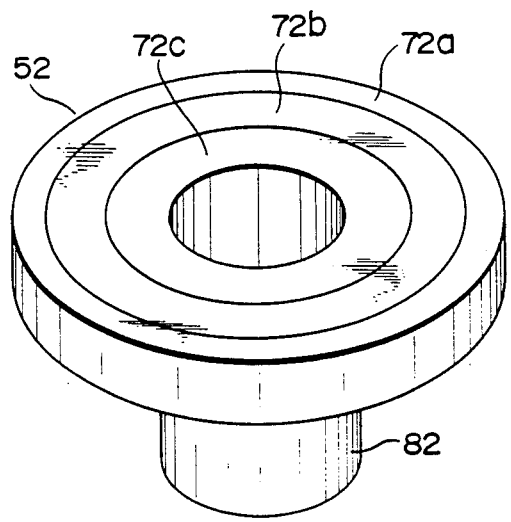
FIG. 3A is a perspective view showing the schematic structure of an upper heat insulator used in an apparatus according to a second embodiment of the present invention.
Figure 3B:
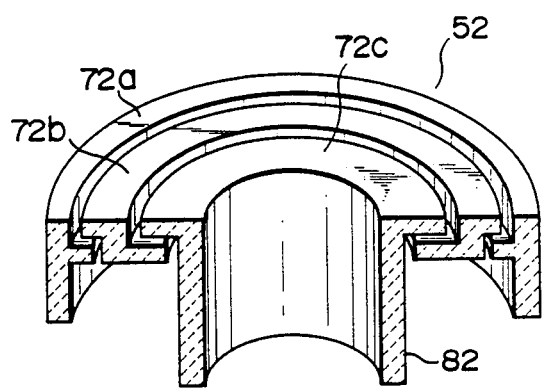
FIG. 3B is a partial sectional perspective view showing the schematic structure of the upper heat insulator shown in FIG. 3A.

FIG. 3A is a perspective view showing the schematic structure of an upper heat insulator used in an apparatus according to a second embodiment of the present invention, and FIG. 3B is a partially sectional perspective view showing the schematic structure of the upper heat insulator shown in FIG. 3A.

The second embodiment differs from the first embodiment in the method of splitting the upper heat insulator. More specifically, in this embodiment, an upper heat insulator 52 consists of three concentrically divided split members 72a, 72b, and 72c. The innermost split member 72c has a cylindrical portion 82.

It is to be noted that the same effect, as in the first embodiment, can be obtained in the second embodiment using the upper heat insulator of the above-mentioned structure.

Figure 4A:
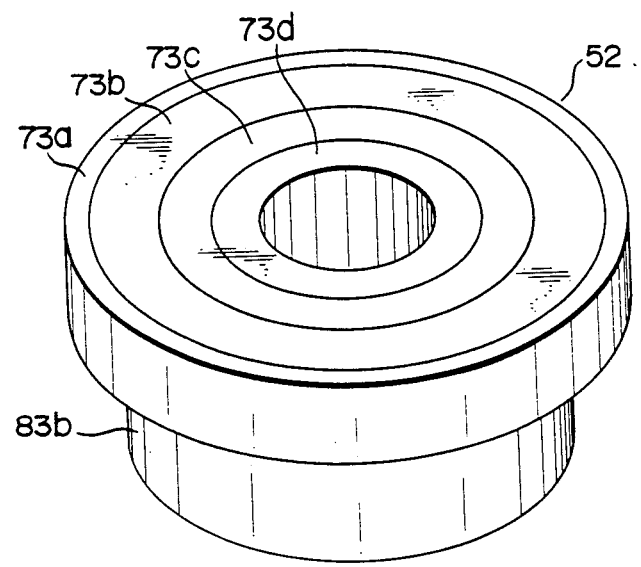
FIG. 4A is a perspective view showing the schematic structure of an upper heat insulator used in an apparatus according to a third embodiment of the present invention.
Figure 4B:
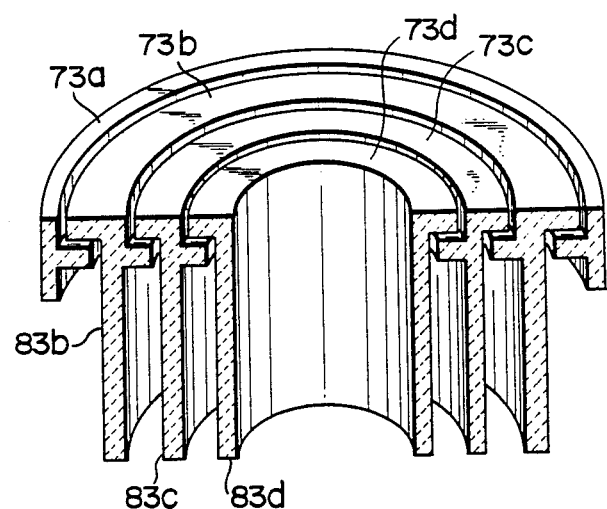
FIG. 4B is a partially sectional perspective view showing the schematic structure of the upper heat insulator shown in FIG. 4A.

FIG. 4A is a perspective view showing the schematic structure of an upper heat insulator used in an apparatus according to a third embodiment of the present invention, and FIG. 4B is a partially sectional perspective view showing the upper heat insulator as shown in FIG. 4A.

The third embodiment is different from the second embodiment in that each of the inner split members (those except for the outermost split member) has a cylindrical portion. Thus, an upper heat insulator 52 of this embodiment comprises four concentrically divided split members 73a, 73b, 73c and 73d, and the inner split members 73b to 73d have cylindrical portions 83b to 83d.

In the embodiment described above, the same effect as in the first embodiment can be obtained, and the inner diameter of the upper heat insulator 52 can be set optimally in accordance with the diameter of the crystal to be manufactured. That is, when the crystal diameter is small (e.g., 2 inches), all the split members 73a to 73d are used. When the crystal diameter is increased to, e.g., 3 or 5 inches, the split member 73d or the split members 73d and 73c are removed. In this manner, the inner diameter of the upper heat insulator 52 can be adjusted optimally in accordance with the diameter of a crystal to be manufactured.

Figure 5:
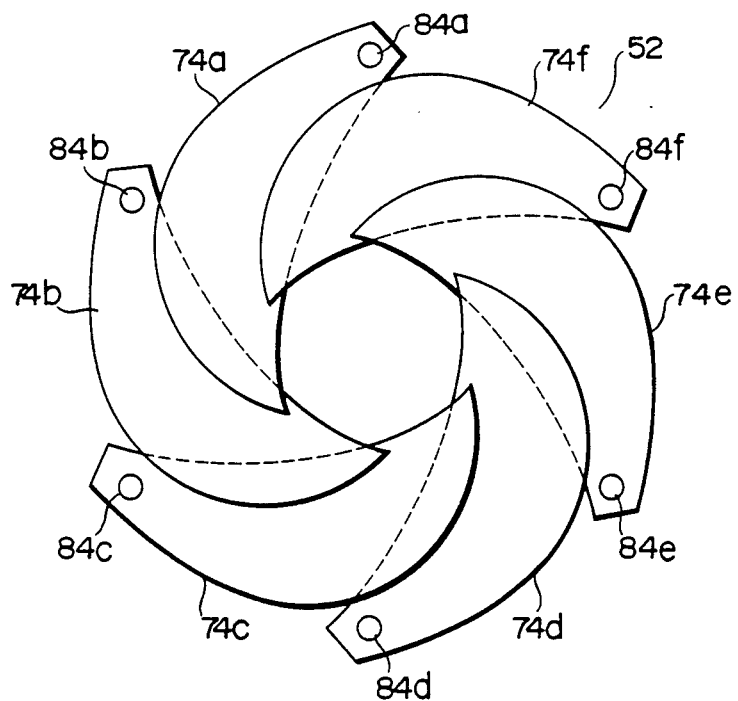
FIG. 5 is a plan view showing the schematic structure of an upper heat insulator used in an apparatus according to a fourth embodiment of the present invention.

FIG. 5 is a plan view showing the schematic structure of an upper heat insulator used in an apparatus according to a fourth embodiment of the present invention.

This embodiment is different from the first embodiment in that an upper heat insulator is divided into blades, as in the case of a camera stop. More specifically, an upper heat insulator 52 of this embodiment consists of six blade-like split members 74a, 74b, 74c, 74d, 74e and 74f. The split members 74a, 74b, 74c, 74d, 74e and 74f are pivotal about pins 84a, 84b, 84c, 84d, 84e and 84f, respectively.

In this embodiment, using the upper heat insulator of the above-mentioned structure, the same effect as that in the first embodiment is obtained. In addition, since the split members 74a to 74f are pivotal, the inner diameter of the upper heat insulator 52 can be varied continuously in accordance with the diameter of the crystal to be manufactured.

Figure 6:
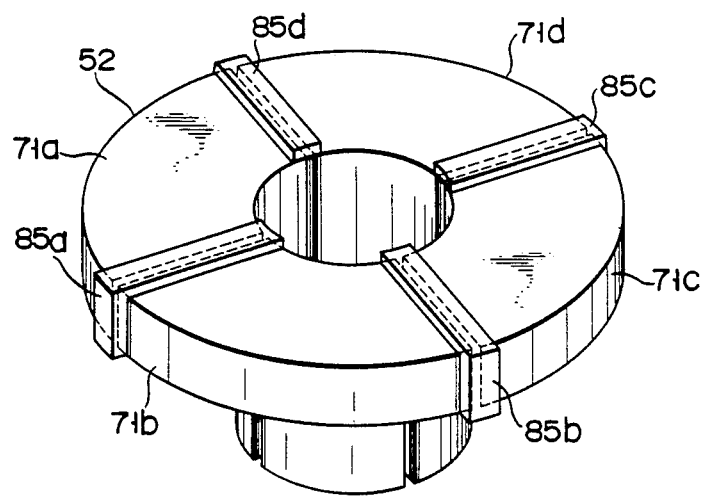

The present invention is not limited to the particular embodiments described above. For example, in the first embodiment, in order to cover the gaps between the respective split members 71a to 71d constituting the upper heat insulator 52, L-shaped cover plates 85a, 85b, 85c, and 85d can be arranged between each two adjacent split members, as shown in FIG. 6. In this case, since heat radiation from the gaps between the respective split members can be prevented, a more efficient heat insulator can be obtained. The number of split members is not limited to that in each embodiment described above, but, rather, can be changed as needed. However, in order to maintain ease of manufacture, and a good mechanical strength of the heat insulator, 3 to 6 split members are, preferably, used.

Figure 7:
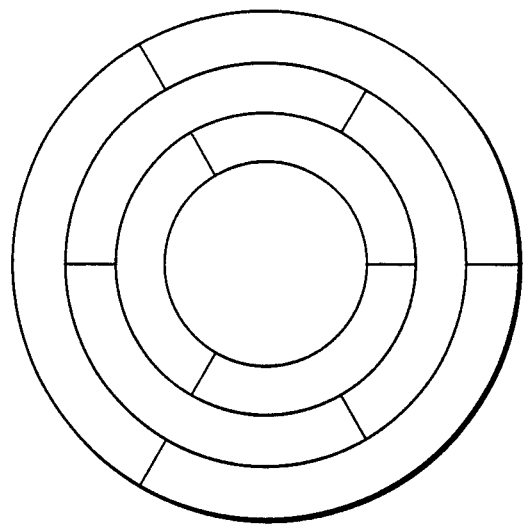
Figure 8A:
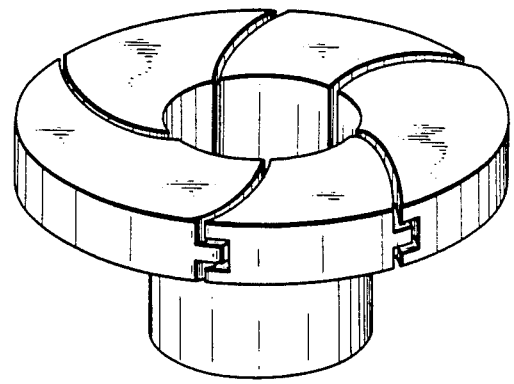
FIGS. 8A to 8E are perspective views showing the schematic structures of upper heat insulators having different split structures.
Figure 8B:
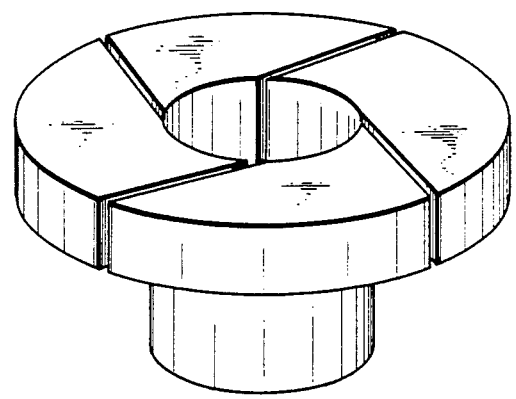
Figure 8C:
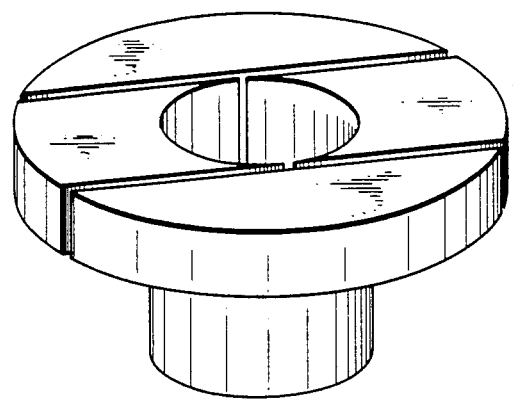
Figure 8D:
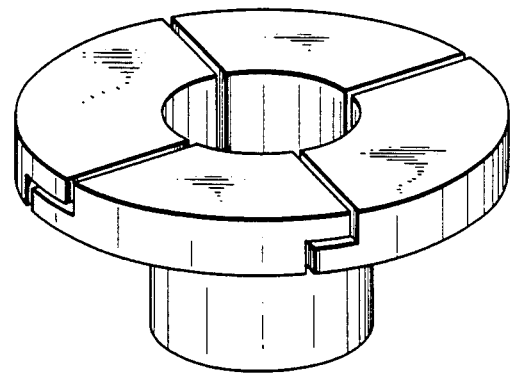
Figure 8E:
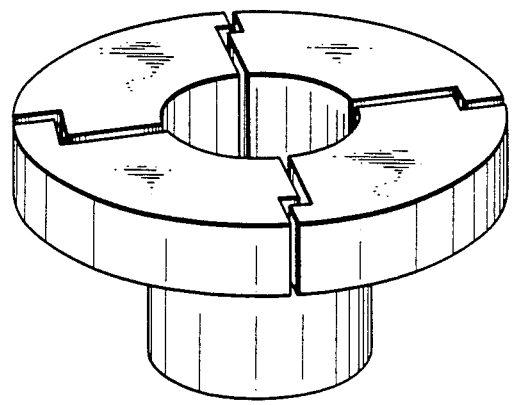
Figure 12:
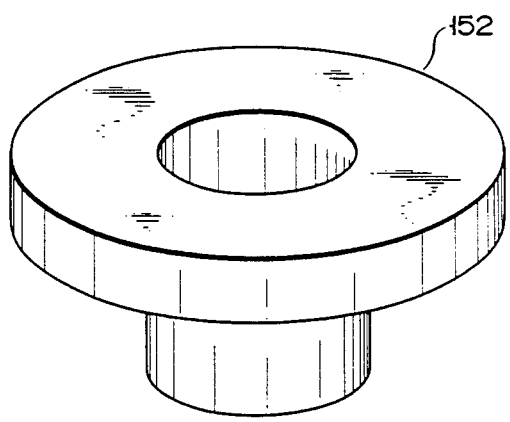
FIG. 12 is a perspective view showing the schematic structure of an upper heat insulator used in the apparatus shown in FIG. 11.

The splitting means of the upper heat insulator is not limited to radial, concentrical, or blade-like splitting. For example, the upper heat insulator can be split in a combination of radial and concentrical splitting, as shown in FIG. 7. The upper heat insulator can also be split in various manners, as shown in FIGS. 8A to 8E. FIG. 8A shows the case of spiral splitting, and FIG. 8B shows the case of splitting into four members without splitting through the axis. FIG. 8C shows the case of parallel splitting into four members, FIG. 8D shows the case of radial splitting with engaging portions for prevention of misalignment along the circumferential direction, and FIG. 8E shows the case of radial splitting with engaging portions for prevention of radial misalignment.

Figure 10A:
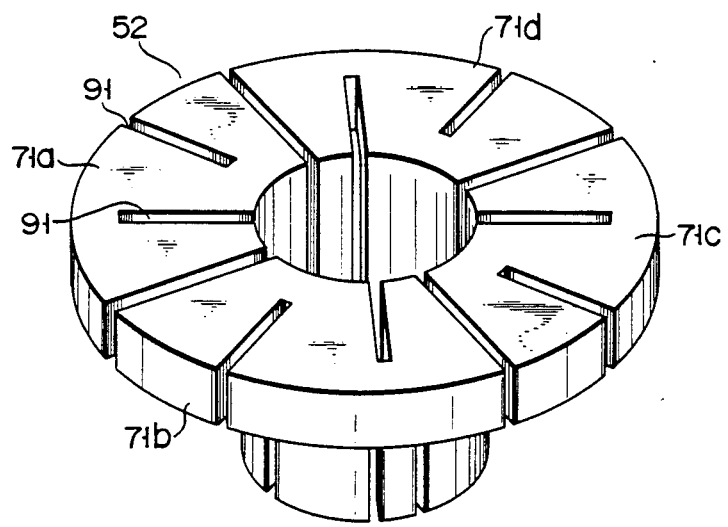
FIG. 10A is a perspective view showing the schematic structure of an upper heat insulator with a radial split structure and slits.
Figure 10B:
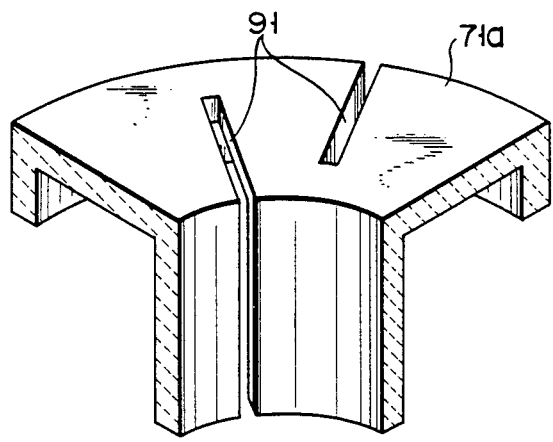

FIG. 9 shows the case of partial splitting wherein a disk-like member is partially split by partial radial slits. As shown in FIGS. 10A and 10B, it is possible to form a plurality of radial slits 91 in each of the radial split members. FIG. 10A is a perspective view showing the overall outer appearance of an upper heat insulator of such a structure, and FIG. 10B is a perspective view showing one split member of the upper heat insulator as shown in FIG. 10A.

The above embodiments were described with reference to pulling of a GaAs single crystal. However, it is to be noted that the present invention is similarly applicable to the manufacture of other III–V group compound semiconductor single crystals such as InP, GaP, or GaSb. The amount of yttria ($Y_2O_3$), as a binder to be mixed with AlN when forming a sintered body, is, preferably, 0.1 to 3% in order to eliminate contamination by the binder and to maintain a high mechanical strength. The material of each split member of the upper heat insulator is not limited to AlN but can be $Al_2O_3$, $ZrO_2$, or compounds having such substances as major constituents, depending upon the application. Various other changes and modifications can also be made within the spirit and scope of the present invention.

What is claimed is:

1. An apparatus for manufacturing a compound semiconductor single crystal by pulling the compound semiconductor single crystal from a raw material melt in a crucible by the LEC method, comprising:
    (a) a crucible for containing a raw material melt and a liquid encapsulating material therein;
    (b) a heat generator arranged outside said crucible so as to be coaxial therewith;
    (c) a heat insulator assembly arranged outside said heat generator so as to surround said heat generator and said crucible, said heat insulating assembly comprising a sintered body formed of a major constituent selected from the group consisting of AlN, $Al_2O_3$ and $ZrO_2$, and including an upper heat insulator arranged above the crucible and having at a center thereof a circular through hole for allowing passage of a single crystal pulled from said crucible therethrough, said upper heat insulator further comprises at least two separate segmented members which contact each other; and
    (d) a container for containing said crucible, said heat generator and said heat insulating assembly therein.

2. The apparatus according to claim 1, wherein said upper heat insulator comprises at least two radially segmented members which form a common disk member.

3. The apparatus according to claim 1, wherein said upper heat insulator comprises at least two concentrically segmented members which form a common disk member.

4. The apparatus according to claim 1, wherein said upper heat insulator comprises 3 to 6 segmented members.

5. The apparatus according to claim 1, wherein said sintered body is obtained by sintering a mixture of $Y_2O_3$ as a binder with AlN, with said AlN comprising a major constituent of said sintered body.

6. The apparatus according to claim 1, wherein said upper heat insulator comprises a plurality of radially segmented members which form a common disk member, and each of said radially segmented members has a plurality of radial slits therein.

7. An apparatus for manufacturing a compound semiconductor single crystal by pulling the compound semiconductor single crystal from a raw material melt in a crucible by the LEC method, comprising:

(a) a crucible for containing a raw material melt and a liquid encapsulating material therein;
(b) a heat generator arranged outside said crucible so as to be coaxial therewith;
(c) a heat insulator assembly arranged outside said heat generator so as to surround said heat generator and said crucible, said heat insulating assembly comprising a sintered body formed of a major constituent selected from the group consisting of AlN, $Al_2O_3$ and $ZrO_2$, and including an upper heat insulator arranged above the crucible and having at a center thereof a circular through hole for allowing passage of a single crystal pulled from said crucible therethrough, said upper heat insulator further comprises at least two separate segmented members which contact each other and which have narrow slits therein; and
(d) a container for containing said crucible, said heat generator and said heat insulating assembly therein.

* * * * *